(12) United States Patent
Mizukami et al.

(10) Patent No.: US 10,599,177 B2
(45) Date of Patent: Mar. 24, 2020

(54) INPUT DEVICE

(71) Applicant: Panasonic Intellectual Property Management Co., Ltd., Osaka (JP)

(72) Inventors: Masahiro Mizukami, Fukui (JP); Seigo Yamanaka, Fukui (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 94 days.

(21) Appl. No.: 15/895,700

(22) Filed: Feb. 13, 2018

(65) Prior Publication Data

US 2018/0239385 A1    Aug. 23, 2018

(30) Foreign Application Priority Data

Feb. 21, 2017  (JP) ................. 2017-030342

(51) Int. Cl.
    *H01H 67/06*    (2006.01)
    *G05G 1/08*    (2006.01)
    *F16D 63/00*    (2006.01)
    *H03K 17/97*    (2006.01)
    *B60K 37/06*    (2006.01)
    (Continued)

(52) U.S. Cl.
    CPC .............. *G05G 1/082* (2013.01); *B60K 37/06* (2013.01); *F16D 63/002* (2013.01); *F16D 65/186* (2013.01); *F16H 59/044* (2013.01); *F16H 59/08* (2013.01); *F16H 59/105* (2013.01); *G05G 5/04* (2013.01); *H03K 17/97* (2013.01); *B60K 2370/126* (2019.05); *F16D 2121/20* (2013.01); *F16H 2059/081* (2013.01);
    (Continued)

(58) Field of Classification Search
    CPC .............. F16H 61/24; F16H 2061/243; F16H 2059/081; F16H 95/08; B60K 20/02; B60K 20/08; G05G 1/015; G05G 1/08; G05G 5/03
    USPC .......................................... 335/114
    See application file for complete search history.

(56) References Cited

U.S. PATENT DOCUMENTS 2,852,615 A * 9/1958 Graybill ................. H01H 67/06
    335/114
3,204,067 A * 8/1965 Brown ................. H01H 13/585
    200/527

(Continued)

FOREIGN PATENT DOCUMENTS

JP    2005-019113 A    1/2005

*Primary Examiner* — Shawki S Ismail
*Assistant Examiner* — Lisa N Homza
(74) *Attorney, Agent, or Firm* — Seed IP Law Group LLP

(57) ABSTRACT

An input device includes a knob, a detector, an electromagnetic brake, an elastic member, and a controller. The detector detects a rotation angle of the knob. The electromagnetic brake regulates rotation of the knob. The elastic member is provided between the knob and the electromagnetic brake. When the current position of the knob in the circumferential direction is not the target position for rotation regulation of the knob, the controller does not activate the electromagnetic brake. When the current position of the knob in the circumferential direction is the target position for rotation regulation of the knob, the controller determines whether to regulate rotation of the knob based on a rotation direction of the knob, or on a rotation angle of the knob that shifts from the holding position of the knob in the circumferential direction due to deformation of the elastic member.

4 Claims, 11 Drawing Sheets

(51) Int. Cl.
  *F16H 59/04* (2006.01)
  *F16H 59/08* (2006.01)
  *F16H 59/10* (2006.01)
  *F16D 65/18* (2006.01)
  *G05G 5/04* (2006.01)
  *F16D 121/20* (2012.01)
  *F16H 61/32* (2006.01)

(52) U.S. Cl.
  CPC ......... *F16H 2061/326* (2013.01); *G05G 1/08* (2013.01); *H03K 2217/94068* (2013.01)

(56) References Cited

U.S. PATENT DOCUMENTS

| | | | | |
|---|---|---|---|---|
| 3,254,174 A * | 5/1966 | Frederick | ............ | H01H 36/006 335/114 |
| 3,748,419 A * | 7/1973 | Torrey | ................ | H01H 1/5844 200/570 |
| 4,016,387 A * | 4/1977 | Aberer | ................ | H01H 19/10 200/303 |
| 4,424,424 A * | 1/1984 | Hollenbeck, Jr. | ...... | H01H 27/06 200/43.08 |
| 4,891,476 A * | 1/1990 | Nation | ................ | H01H 13/585 200/11 R |
| 5,226,529 A * | 7/1993 | Valenzona | ........... | H01H 13/585 200/527 |
| 5,901,835 A * | 5/1999 | Hung | ................ | H01H 19/025 200/316 |
| 6,166,339 A * | 12/2000 | Bechis | ................ | H01H 35/143 200/61.45 R |
| 6,180,905 B1 * | 1/2001 | Pollock | ................ | H01H 13/023 200/314 |
| 6,188,332 B1 * | 2/2001 | Scarlata | ................ | G01D 5/145 200/19.07 |
| 6,365,849 B1 * | 4/2002 | Ono | ................ | H01H 25/065 200/14 |
| 6,396,015 B1 * | 5/2002 | Ko | ................ | H01H 13/585 200/527 |
| 7,124,648 B2 * | 10/2006 | Shibazaki | ............ | B60K 37/06 73/862.08 |
| 7,498,538 B1 * | 3/2009 | Tittle | ................ | H01H 1/36 200/536 |
| 7,741,938 B2 * | 6/2010 | Kramlich | ............ | B60K 37/06 335/77 |
| 7,880,107 B1 * | 2/2011 | Srbinovski | ............ | H01H 13/48 200/406 |
| 2004/0231434 A1 * | 11/2004 | Shibazaki | ............ | B60K 37/06 73/862.08 |
| 2007/0267283 A1 * | 11/2007 | Hiroe | ................ | H01H 5/02 200/179 |
| 2007/0279401 A1 * | 12/2007 | Ramstein | ................ | G06F 3/016 345/184 |
| 2008/0097269 A1 * | 4/2008 | Weinberg | ................ | A61F 2/68 602/16 |
| 2009/0000407 A1 * | 1/2009 | Meyer | ................ | B60K 37/06 74/10.1 |
| 2009/0000413 A1 * | 1/2009 | Furhoff | ................ | B60K 37/06 74/473.3 |
| 2011/0181405 A1 * | 7/2011 | Periquet | ................ | F16F 9/535 340/407.2 |
| 2015/0027861 A1 * | 1/2015 | Hoskins | ................ | F16H 59/08 200/43.11 |

* cited by examiner

INPUT DEVICE

The present application claims the benefit of foreign priority of Japanese patent application 2017-030342 filed on Feb. 21, 2017, the contents all of which are incorporated herein by reference.

BACKGROUND

1. Technical Field

The present disclosure relates to an input device, such as an input device which includes a knob and an electromagnetic brake capable of regulating a rotation of a knob.

2. Description of the Related Art

A force feedback device disclosed in Unexamined Japanese Patent Publication No. 2005-19113, which is an example of a conventional input device, includes an operation knob, a rotary encoder which detects a rotation angle of the operation knob, an electromagnetic brake which prevents rotation of the operation knob, and an elastic member interposed between the operation knob and the electromagnetic brake.

When a rotation angle of the operation knob reaches a predetermined angle, the operation knob is locked by the electromagnetic brake. With further rotation of the operation knob in the state where rotation of operation knob is prevented by the electromagnetic brake, the elastic member is bent to allow further rotation of the operation knob. When a rotation direction of the operation knob detected in this state is a regulation direction of the operation knob, locking of the operation knob continues. When the rotation direction is not the regulation direction, locking of the operation knob is canceled.

SUMMARY

The present disclosure provides an input device capable of reducing power consumption, while reducing operational discomfort during rotation of a knob by an operator.

An input device according to an aspect of the present disclosure includes a knob, a detector, an electromagnetic brake, an elastic member, and a controller. The knob is rotatable and held at a predetermined holding position when the knob is not operated. The detector detects a rotation angle of the knob in a circumferential direction around a rotation axis of the knob. The electromagnetic brake regulates rotation of the knob. The elastic member is provided between the knob and the electromagnetic brake, and integrally rotates with the knob. The rotation of the elastic member is regulated by the electromagnetic brake. The controller controls the electromagnetic brake based on a detection result obtained by the detector. When the current position of the knob in the circumferential direction is not the target position for rotation regulation of the knob, the controller does not activate the electromagnetic brake. When the current position of the knob in the circumferential direction is the target position for rotation regulation of the knob, the controller determines whether to regulate rotation of the knob based on a rotation direction of the knob, or on a rotation angle of the knob that shifts from the holding position of the knob in the circumferential direction due to deformation of the elastic member.

According to this configuration, the knob stops at the holding position when an operator does not hold the knob, or does not perform other operation of the knob, for example. In this case, there is no possibility or low possibility that the knob is rotated in the regulation direction. Accordingly, the electromagnetic brake is stopped without regulating the rotation of the knob, and power consumption by the electromagnetic brake can be reduced.

In addition, when the operator holding the knob shifts the knob in the regulation direction from the holding position and stops the knob at the shifted position, for example, the possibility of rotation of the knob in the regulation direction is a certain level or high. Accordingly, the electromagnetic brake is activated to regulate rotation of the knob beforehand. On the other hand, when the operator holding the knob shifts the knob in a direction opposite to the regulation direction from the holding position and stops the knob at the shifted position, there is no possibility or low possibility that the knob is rotated in the regulation direction. In this case, the electromagnetic brake is stopped to allow rotation of the knob beforehand. Accordingly, even if the operator rapidly rotates the knob in a subsequent step to change the rotation direction of the knob, the operator feels as if there is a wall for preventing rotation of the knob in the regulation direction and allowing rotation of the knob in the opposite direction. Operational discomfort is therefore reduced during rotation of the knob by the operator.

According to the input device described above, the controller may be configured not to activate the electromagnetic brake when the current position of the knob in the circumferential direction is the target position for rotation regulation of the knob and when the knob does not shift from the holding position. According to this configuration, even if the knob is at the target position for rotation regulation, the electromagnetic brake is stopped when there is no possibility or low possibility that the knob is rotated in the regulation direction. Accordingly, power consumption by the electromagnetic brake is reduced.

According to the input device described above, the controller may be configured to activate the electromagnetic brake when the current position of the knob in the circumferential direction is the target position for rotation regulation of the knob and when the knob shifts in the rotation regulation direction of the knob from the holding position. According to this configuration, rotation of the knob in the regulation direction is regulated beforehand. Accordingly, even if the knob is rapidly rotated in the regulation direction, the rotation of the knob in the regulation direction is reliably prevented so that the operator can operate the knob without operational discomfort.

According to the input device described above, the controller may be configured not to activate the electromagnetic brake when the current position of the knob in the circumferential direction is the target position for rotation regulation of the knob and when the knob shifts in a direction opposite to the rotation regulation direction of the knob from the holding position. According to this configuration, rotation of the knob in the direction opposite to the regulation direction is allowed beforehand. Accordingly, even if the knob is rapidly rotated in the opposite direction, this rotation of the knob is not prevented and the operator can operate the knob without operational discomfort.

The present disclosure provides an input device capable of reducing power consumption, while reducing operational discomfort during rotation of a knob by an operator.

The characteristics and advantages of the present disclosure will become apparent from the following detailed description of a preferred exemplary embodiment with reference to the accompanying drawings.

DETAILED DESCRIPTION

Figure 1:
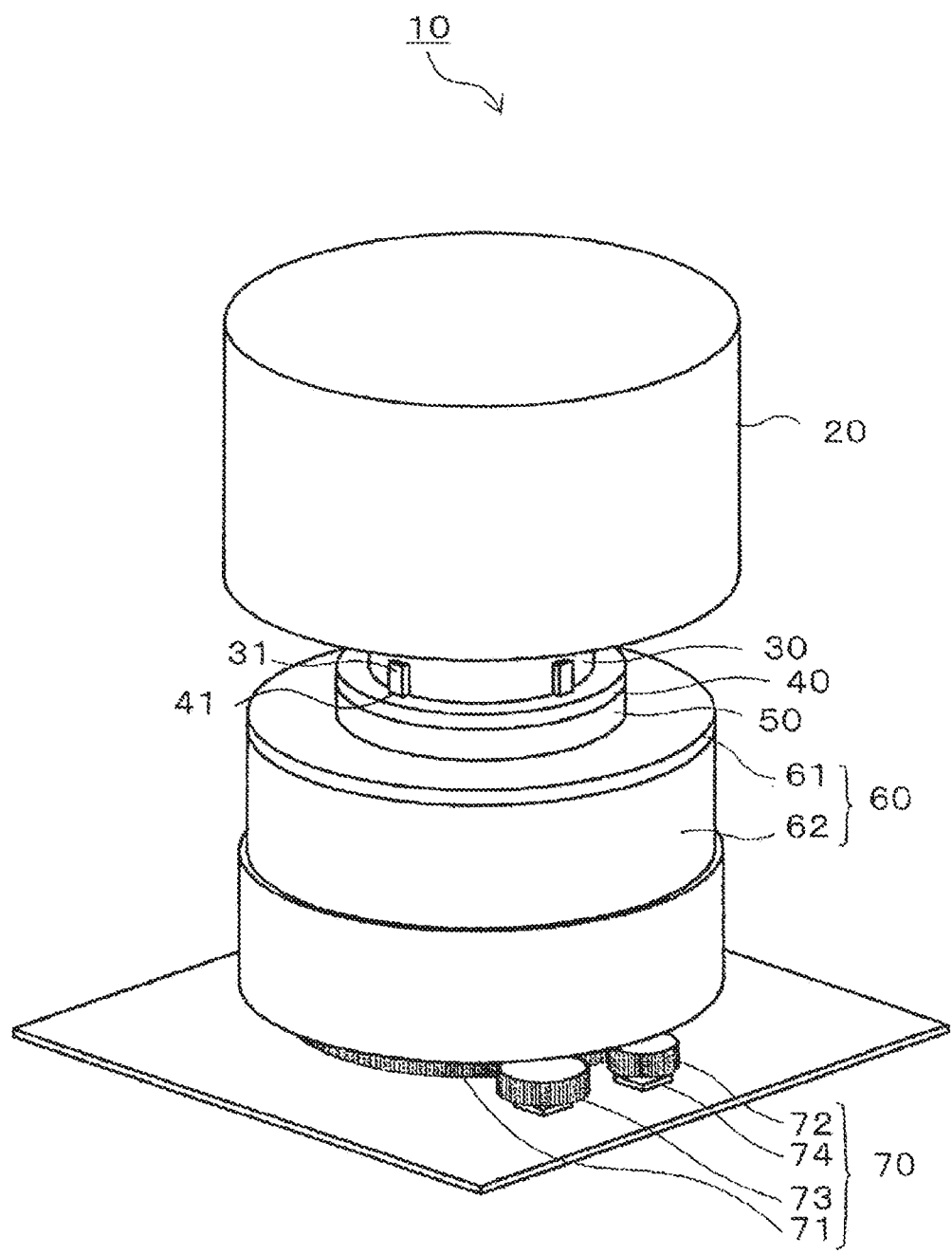
FIG. 1 is a perspective view schematically illustrating an input device according to an exemplary embodiment of the present disclosure.
Figure 2:
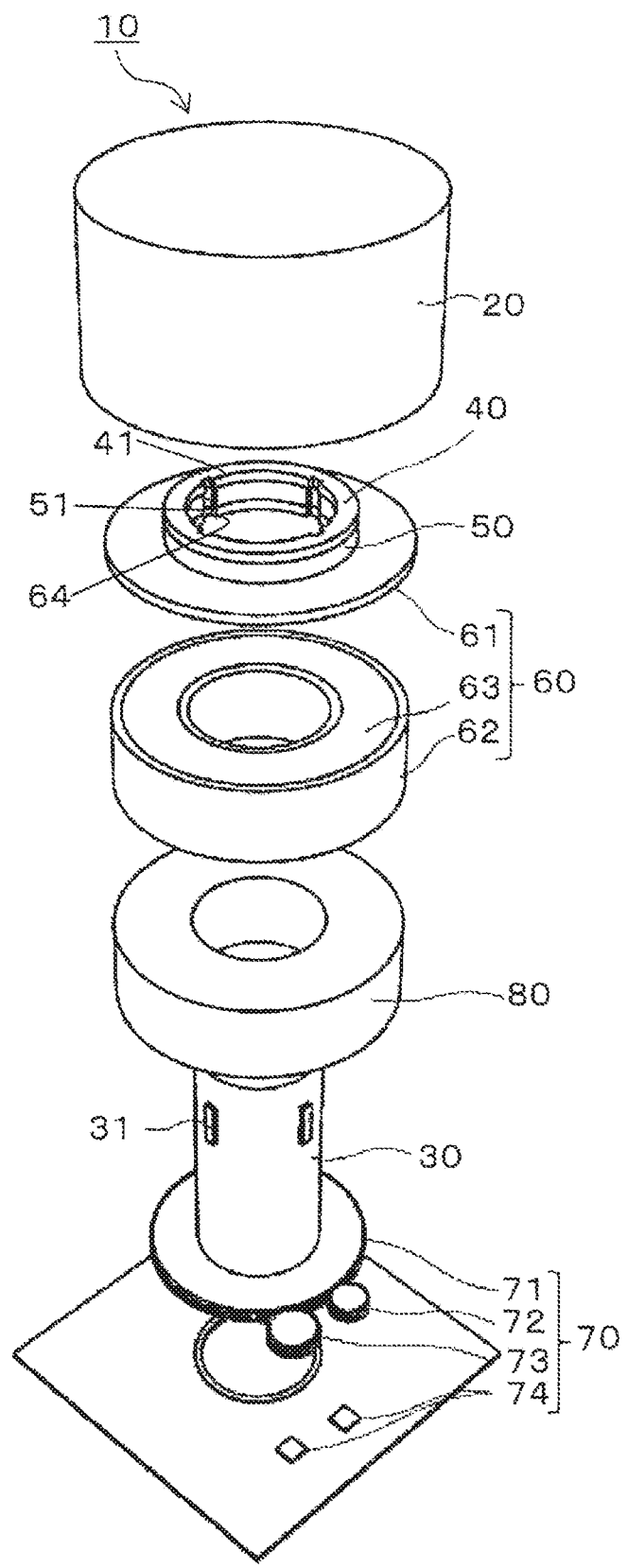
FIG. 2 is an exploded perspective view of the input device illustrated in FIG. 1.

Prior to describing exemplary embodiments according to the present disclosure, problems arising from conventional techniques will be briefly described. When an operation knob not provided with an elastic member is rotated in a regulation direction by a predetermined rotation angle, for example, rotation of the operation knob is locked by an electromagnetic brake. In this case, locking may not be canceled in time in response to rapid rotation of the operation knob in a direction opposite to the regulation direction to change the rotation direction of the knob immediately after rotation of the knob in the regulation direction. When this situation occurs, the operation knob is difficult to rotate in the opposite direction as well as in the regulation direction, and gives operational discomfort to an operator during rotation of the operation knob.

To overcome this problem, the force feedback input device according to Unexamined Japanese Patent Publication No. 2005-19113 described above includes the elastic member which bends in a state where rotation of the operation knob is prevented by the electromagnetic brake. Whether to lock the operation knob is determined based on the rotation direction of the operation knob allowed to rotate by the bend of the elastic member. In this manner, the problem of rotation prevention of the operation knob in both the regulation direction and the opposite direction decreases even if the operation knob is rapidly rotated to change the rotation direction. Accordingly, an operator is given such an operational feeling as if there is a wall for preventing rotation of the operation knob in the regulation direction and allowing rotation of the operation knob in the opposite direction at a predetermined rotation angle.

However, according to the force feedback input device in Unexamined Japanese Patent Publication No. 2005-19113 described above, locking of the operation knob is controlled based on only the rotation direction of the operation knob. In this case, for example, the operation knob is locked by the electromagnetic brake even if there is no possibility or low possibility that the operation knob is rotated in the regulation direction. Locking in such a condition may produce wasteful power consumption by an electromagnet of the electromagnetic brake.

First Exemplary Embodiment

An exemplary embodiment according to the present disclosure is hereinafter specifically described with reference to the drawings. Identical or corresponding elements depicted in all the figures are given identical reference numbers, and the same explanation of these elements is not repeated herein. For convenience of following explanation, a knob side with respect to a shaft member is defined as an upper side, while the opposite side is defined as a lower side. However, a direction of an input device during use is not limited to the direction where a knob is located on the upper side with respect to the shaft member, but may be any other directions.

A configuration of input device 10 according to the present exemplary embodiment is initially described with reference to FIG. 1. Input device 10 includes knob 20 to be rotated.

Knob 20 has a pillar shape such as a columnar shape. A rotation axis of knob 20 extends in a vertical direction. A lower face of knob 20 connects to an upper end of shaft member 30. Shaft member 30 has a pillar shape such as a columnar shape. A rotation axis of shaft member 30 is identical to the rotation axis of knob 20 and extends in the vertical direction, and penetrates respective inner openings of connection member 40, elastic member 50, and electromagnetic brake 60 each having a tubular shape such as a cylindrical shape. Connection member 40 is fixed to shaft member 30 in a circumferential direction around a rotation axis of connection member 40 by engagement between projections 31 of shaft member 30 and first grooves 41 of connection member 40.

Elastic member 50 is connected to a lower face of connection member 40 and an upper face of armature 61 of electromagnetic brake 60. Accordingly, elastic member 50 is positioned between knob 20 and electromagnetic brake 60 with shaft member 30 and connection member 40 interposed between elastic member 50 and knob 20. Electromagnetic brake 60 regulates rotation of knob 20 via elastic member 50, connection member 40, and shaft member 30. Detector 70 is disposed below yoke 62 of electromagnetic brake 60 to detect a rotation angle of knob 20 in a circumferential direction around the rotation axis of knob 20.

The configuration of input device 10 is now described in detail with reference to FIGS. 2 to 6. A plurality of (four in the present exemplary embodiment) projections 31 are provided on an outer circumferential surface of shaft member 30 illustrated in FIG. 2. Four projections 31 are disposed at equal intervals in a circumferential direction of shaft member 30. Each of projections 31 is a plate-shaped body extending in the vertical direction, and radially projects with respect to the rotation axis of shaft member 30.

Four first grooves 41 are formed in an inner circumferential surface of connection member 40 at equal intervals in the circumferential direction. Each of first grooves 41 extends in the vertical direction, and has a circumferential width equivalent to each circumferential width of projections 31 of shaft member 30. First grooves 41 therefore engage with corresponding projections 31 provided on an outer circumferential surface of shaft member 30 facing the inner circumferential surface of connection member 40. In this condition, projections 31 of shaft member 30 rotatable around the rotation axis extending in the vertical direction engage with edges of corresponding first grooves 41 of connection member 40 in the circumferential direction around the rotation axis. Accordingly, connection member 40 rotates with rotation of shaft member 30.

Elastic member 50 has a rotation axis identical to the rotation axis of shaft member 30. An upper face of elastic member 50 is connected to the lower face of connection member 40. Accordingly, elastic member 50 is fixed to shaft member 30 via connection member 40 in the circumferential direction around the rotation axis. Elastic member 50 is made of elastomer, for example, and has elasticity in the circumferential direction around the rotation axis. Accordingly, elastic member 50 receives rotational force from shaft member 30 via connection member 40 in accordance with rotation of shaft member 30, and deforms in the circumferential direction around the rotation axis by the rotational force.

Four second grooves 51 are formed in an inner circumferential surface of elastic member 50 at equal intervals in the circumferential direction. Each of second grooves 51 extends in the vertical direction, and is disposed so as to linearly connect with corresponding first groove 41 of connection member 40. Accordingly, projections 31 of shaft member 30 engage with both first grooves 41 and second grooves 51.

Electromagnetic brake 60 further includes electromagnet 63 in addition to armature 61 and yoke 62. Each of armature 61, yoke 62, and electromagnet 63 has a rotation axis identical to the rotation axis of shaft member 30, and surrounds shaft member 30.

Armature 61 is made of a magnetic material such as iron. Four third grooves 64 are formed in an inner circumferential surface of armature 61 at equal intervals in the circumferential direction. An upper face of armature 61 is connected to a lower face of elastic member 50 such that third grooves 64 extending in the vertical direction connect with corresponding second grooves 51 of elastic member 50. Accordingly, projections 31 of shaft member 30 engage with second grooves 51 and third grooves 64.

Yoke 62 made of a magnetic material such as iron is a member for increasing magnetic force of electromagnet 63. An annular groove is formed in yoke 62 to store electromagnet 63 in this groove. Electromagnet 63 is configured by a conductive coil, and generates magnetic force when energized from the outside. When electromagnet 63 is fitted into the annular groove of yoke 62, an upper face of electromagnet 63 faces a lower face of armature 61.

Detector 70 is a device which detects a rotation angle of shaft member 30, and includes main gear 71, first gear 72, second gear 73, and detection elements 74. Main gear 71 has a disk shape, and includes a plurality of teeth on an outer circumferential surface of main gear 71, for example. Main gear 71 has a rotation axis identical to the rotation axis of shaft member 30. An upper face of main gear 71 is connected to a lower end of shaft member 30. Accordingly, main gear 71 rotates with rotation of shaft member 30.

Each of first gear 72 and second gear 73 has a disk shape, and has an outer circumferential surface provided with a plurality of teeth. First gear 72 and second gear 73 have diameters different from each other. A magnet is attached to each of first gear 72 and second gear 73. First gear 72 and second gear 73 are provided on a side of main gear 71 such that the respective teeth of first gear 72 and second gear 73 engage with the teeth of main gear 71. Accordingly, first gear 72 and second gear 73 rotate with rotation of main gear 71.

Detection elements 74 are configured by a first detection element which is a magnetoresistive element for detecting a magnetic field of the magnet of first gear 72 to detect rotation of first gear 72, and a second detection element which is a magnetoresistive element for detecting a magnetic field of the magnet of second gear 73 to detect rotation of second gear 73. Absolute rotation angles of main gear 71, and shaft member 30 connected to main gear 71 are obtained based on rotations of first gear 72 and second gear 73 detected by detection elements 74. In addition, a rotation angle of knob 20 connected to shaft member 30 is obtained based on the rotation angle of shaft member 30 detected by detector 70.

When the absolute rotation angle of knob 20 is not required, instead of the configuration including both first gear 72 and second gear 73, one of first gear 72 and second gear 73 may be provided. Detector 70 may be configured by a rotary encoder or other known techniques, rather than the configuration described herein.

Moderator 80 has a tubular shape such as a cylindrical shape and a square tubular shape, for example. Shaft member 30 penetrates an opening formed at a center of moderator 80, and rotates relative to moderator 80. Moderator 80 applies force or the like to shaft member 30 each time shaft member 30 is rotated by a predetermined angle, to give a feeling of moderation to the operator via shaft member 30.

Moderator 80 includes a pin urged toward a notch, for example. Force, which is generated when the pin in a state fitted into the notch shifts to a state separated from the notch, is transmitted to a hand of a person (operator) who rotates knob 20 as a feeling of moderation (feeling of click). Moderator 80 may generate a feeling of moderation by utilizing magnetism.

According to the present exemplary embodiment, when knob 20 is not operated, i.e., when knob 20 is not held, or is held but not rotated, moderator 80 holds knob 20 at a predetermined holding position via shaft member 30. The predetermined holding position corresponds to a predetermined position in a rotation angle range of knob 20 in each of a plurality of ranges (P, R, N, D, described below (e.g., middle point of rotation angle range in circumferential direction).

Figure 3:
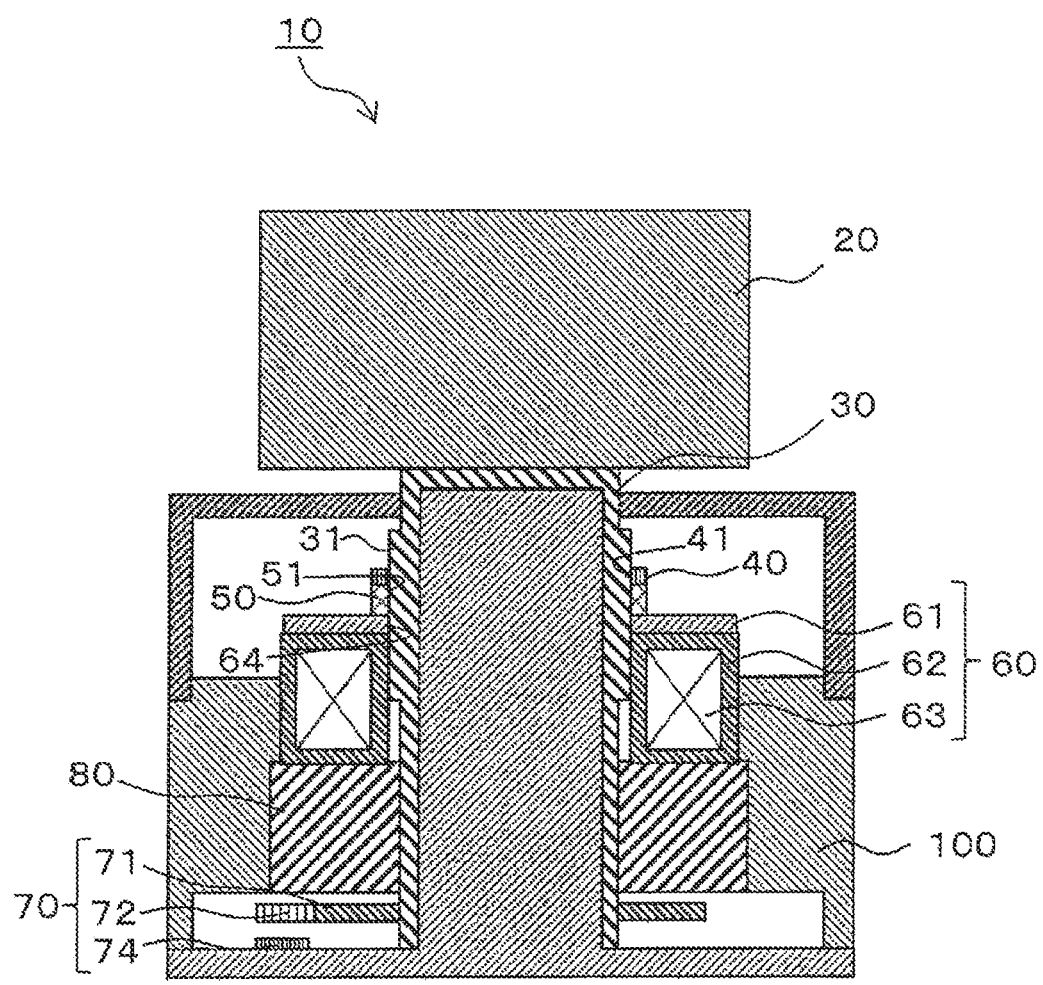
FIG. 3 is a cross-sectional view of the input device illustrated in FIG. 1.

As illustrated in FIG. 3, an inside diameter of yoke 62 of electromagnetic brake 60 is set larger than an outside diameter of shaft member 30 at the positions provided with projections 31. In this case, shaft member 30 is rotatable relative to electromagnet 63 and yoke 62 when electromagnet 63 within yoke 62 is not energized and electromagnetic brake 60 is stopped.

On the other hand, yoke 62 of electromagnetic brake 60 is fixed to housing 100 and the like. Accordingly, magnetic force of electromagnet 63 attracts armature 61 facing electromagnet 63 when electromagnet 63 within yoke 62 is energized. In the fixed state of armature 61, rotations of elastic member 50, connection member 40, shaft member 30, and knob 20 connected to armature 61 are regulated. However, elastic member 50 is deformed in a space between armature 61 and connection member 40, and connection member 40, shaft member 30, and knob 20 are allowed to slightly rotate within a range of this space.

Figure 4:
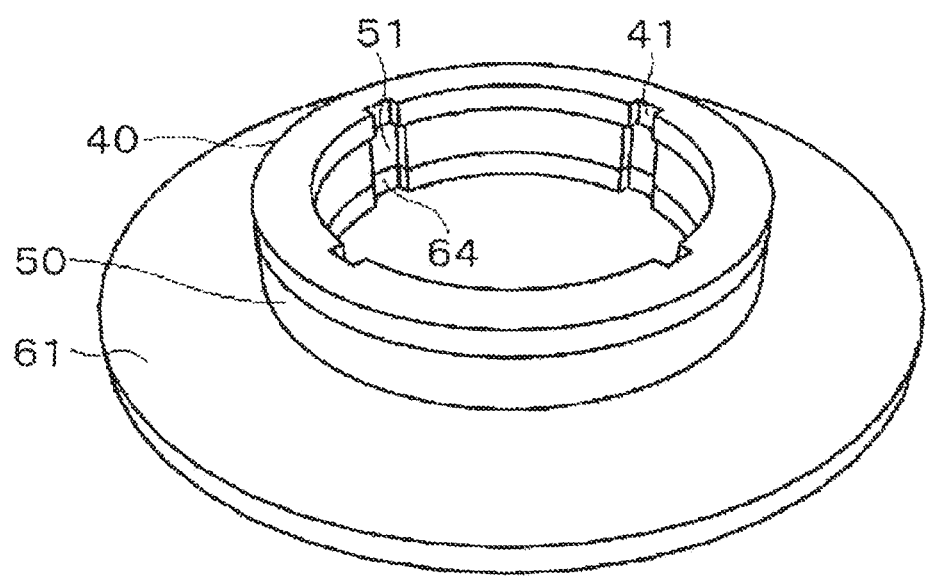
FIG. 4 is a perspective view illustrating a connection member, an elastic member, and an armature illustrated in FIG. 1.
Figure 5:
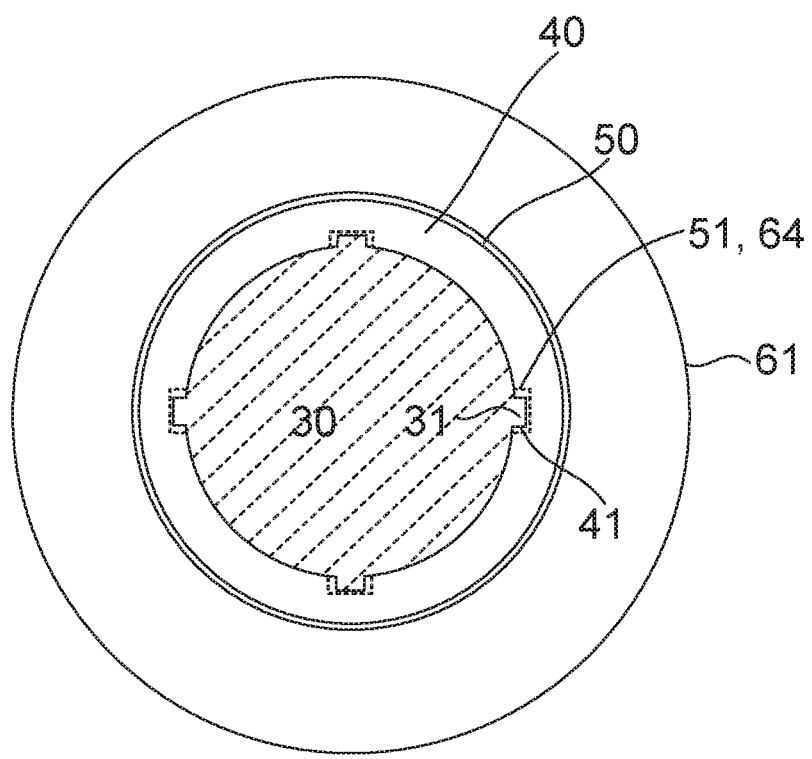
FIG. 5 is a cross-sectional view of the input device when a shaft member (projections) illustrated in FIG. 1 is located at an intermediate position.

As illustrated in FIG. 4, each width of second grooves 51 of elastic member 50, and each width of third grooves 64 of armature 61 in the circumferential direction of the rotation axis are larger than each width of first grooves 41 of connection member 40. As illustrated in FIG. 5, each width of first grooves 41 is equivalent to each width of projections 31 of shaft member 30 in the circumferential direction. Accordingly, a clearance (play) is provided between respective edges of each projection 31 and each second groove 51 and third groove 64 in the circumferential direction.

When knob 20 (FIG. 1) is not operated, knob 20 is disposed in the circumferential direction in such a position that each projection 31 is located at centers (intermediate position) of second groove 51 and third groove 64 in the circumferential direction. In this state, knob 20 is located at a predetermined holding position. Accordingly, elastic member 50 does not deform, and each projection 31 is located at the intermediate position. More specifically, when knob 20 is not operated (when knob 20 receives no force in rotational direction), knob 20 and shaft member 30 are disposed with respect to elastic member 50 and armature 61 such that knob 20 is located at the holding position, and that each projection 31 is located at the intermediate position.

When each projection 31 is located at the intermediate position, a width of one clearance between one end of each projection 31 and each edge of second groove 51 and third groove 64 facing the one end of corresponding projection 31 in the circumferential direction is equivalent to a width of the other clearance between the other end of corresponding projection 31 and each edge of second groove 51 and third groove 64 facing the other end of corresponding projection 31 in the circumferential direction. For example, each width of these clearances is set to 2.5 degrees.

Figure 6:
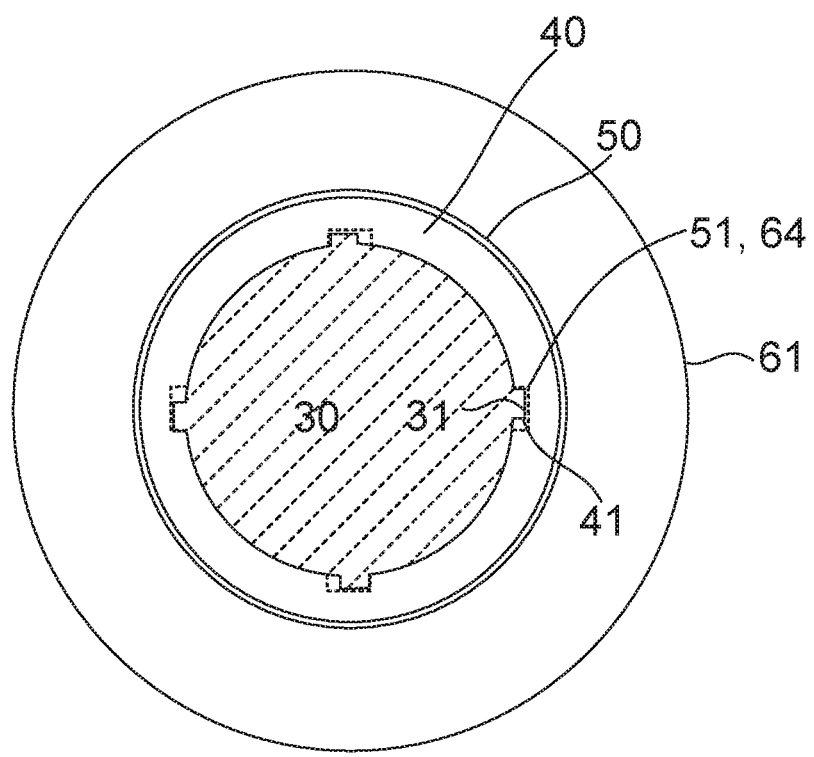
FIG. 6 is a cross-sectional view of the input device when the shaft member (projections) illustrated in FIG. 1 is shifted from the intermediate position.

When knob 20 (FIG. 1) is operated to rotate from the holding position as illustrated in FIG. 6, elastic member 50 deforms and allows each projection 31 of shaft member 30 to shift from the intermediate position in the circumferential direction. When each projection 31 is shifted from the intermediate position, the width of the one clearance is different from the width of the other clearance. In this case, shaft member 30 is allowed to rotate until each projection 31 is brought into contact with the edge of third groove 64 due to deformation of elastic member 50.

When force applied to knob 20 (FIG. 1) is stopped, shaft member 30 rotates in the circumferential direction due to elastic force (restoring force) of elastic member 50. In this case, each projection 31 of shaft member 30 returns to the intermediate position corresponding to a mechanical center position, and holds knob 20 at the holding position as illustrated in FIG. 5.

Figure 7:
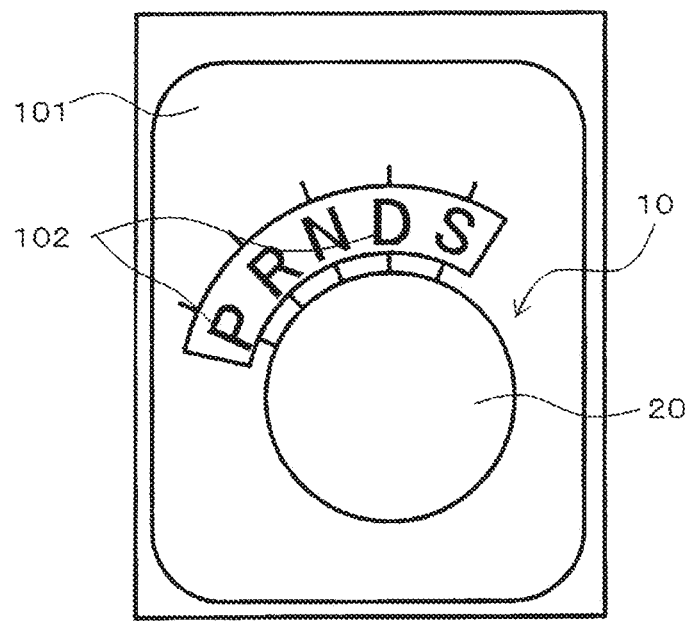
FIG. 7 is a view illustrating the input device applied to a selector.

With reference to FIG. 7, input device 10 applied to a selector operated by an operator to input a range to a transmission of a vehicle (not shown) is hereinafter described. For example, input device 10 in this application example is stored in case 101 of the vehicle. However, input device 10 may be used for other purposes and placed at other installation positions.

Knob 20 of input device 10 projects from a surface of case 101, while other parts are stored in case 101. Display 102 indicating ranges is provided on the surface of case 101.

For example, display 102 indicates ranges of P, R, N, D, and S on case 101 around knob 20 at equal intervals in the circumferential direction of knob 20. Knob 20 is rotated by the operator to select one of ranges P (parking), R (reverse (backward drive)), N (neutral), D (drive (forward drive)), and S (sport mode). An individual rotation angle range of knob 20 is allocated to each of ranges P, R, N, D, and S.

Figure 8:
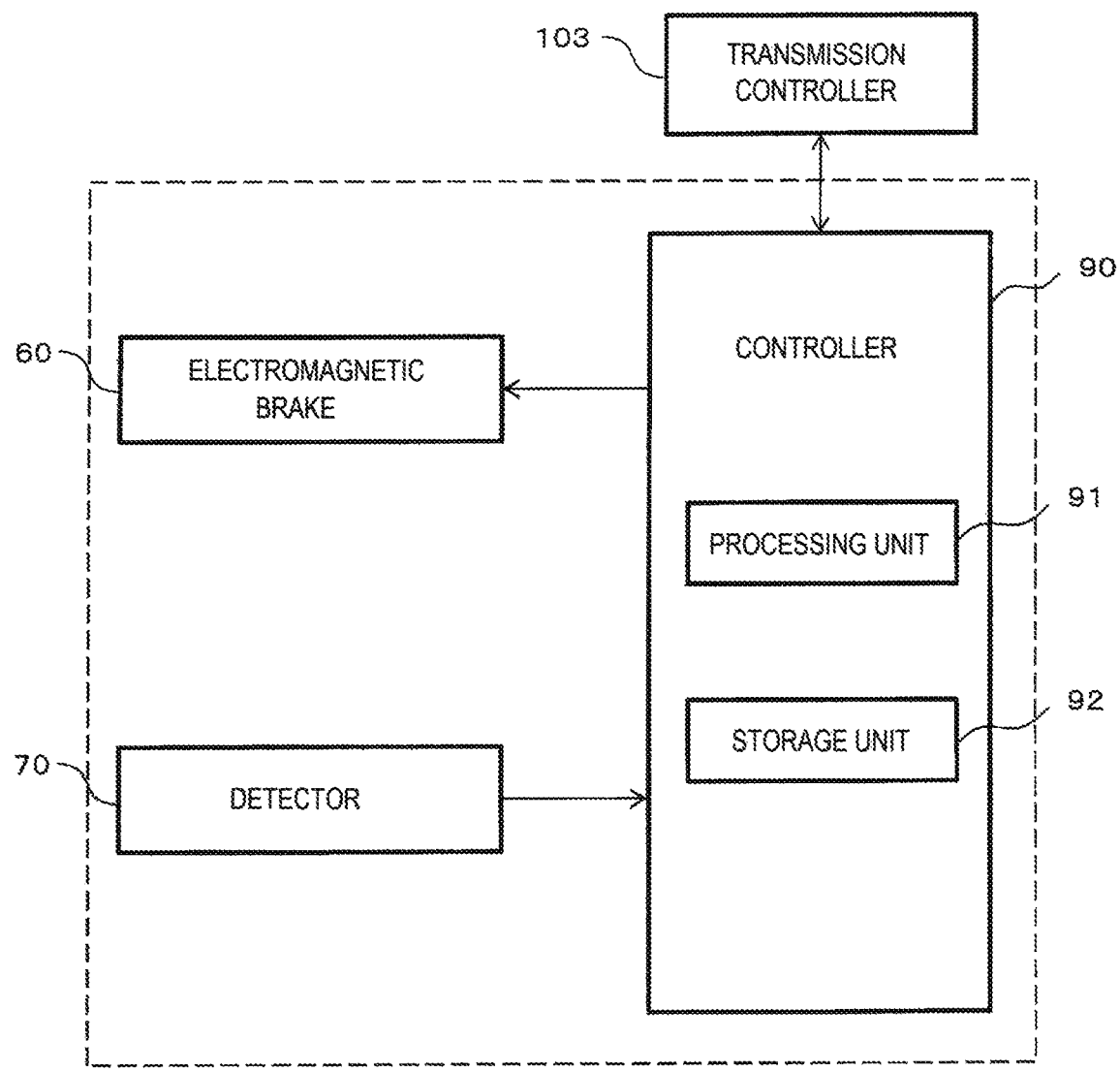
FIG. 8 is a block diagram illustrating a configuration of a controller included in the input device illustrated in FIG. 1.

Controller 90 included in input device 10 is hereinafter described with reference to FIG. 8. Controller 90 is a device which controls electromagnetic brake 60 and switching of ranges based on a detection result obtained by detector 70. Controller 90 includes processing unit 91 such as a central processing unit (CPU), and storage unit 92 such as a read-only memory (ROM) and a random-access memory (RAM). Controller 90 is electrically connected to electromagnetic brake 60 and detector 70, and further to transmission controller 103. Controller 90 may be configured by either a single control device performing centralized control, or a plurality of control devices each performing distributed control in cooperation with each other.

Storage unit 92 stores basic programs for controlling electromagnetic brake 60 and switching of ranges, and information such as various types of fixed data. Processing unit 91 reads and executes software such as the basic programs stored in storage unit 92 to control various types of operations.

For example, controller 90 determines a range associated with a rotation angle of knob 20 beforehand based on a rotation angle of shaft member 30 output from detector 70 as the rotation angle of knob 20. Controller 90 outputs the determined range to transmission controller 103 to set the range of transmission controller 103 to the determined range. Controller 90 further controls electromagnetic brake 60 based on information set for respective ranges beforehand to indicate activation or stop of electromagnetic brake 60.

An operation method of input device 10 is hereinafter described with reference to FIGS. 9 to 11. The operation method of input device 10 is controlled by controller 90. This control is repeated at predetermined time intervals. In the following description, an anticlockwise direction is referred to as a rotation angle decreasing direction, while a clockwise direction is referred to as a rotation angle increasing direction.

Figure 9:
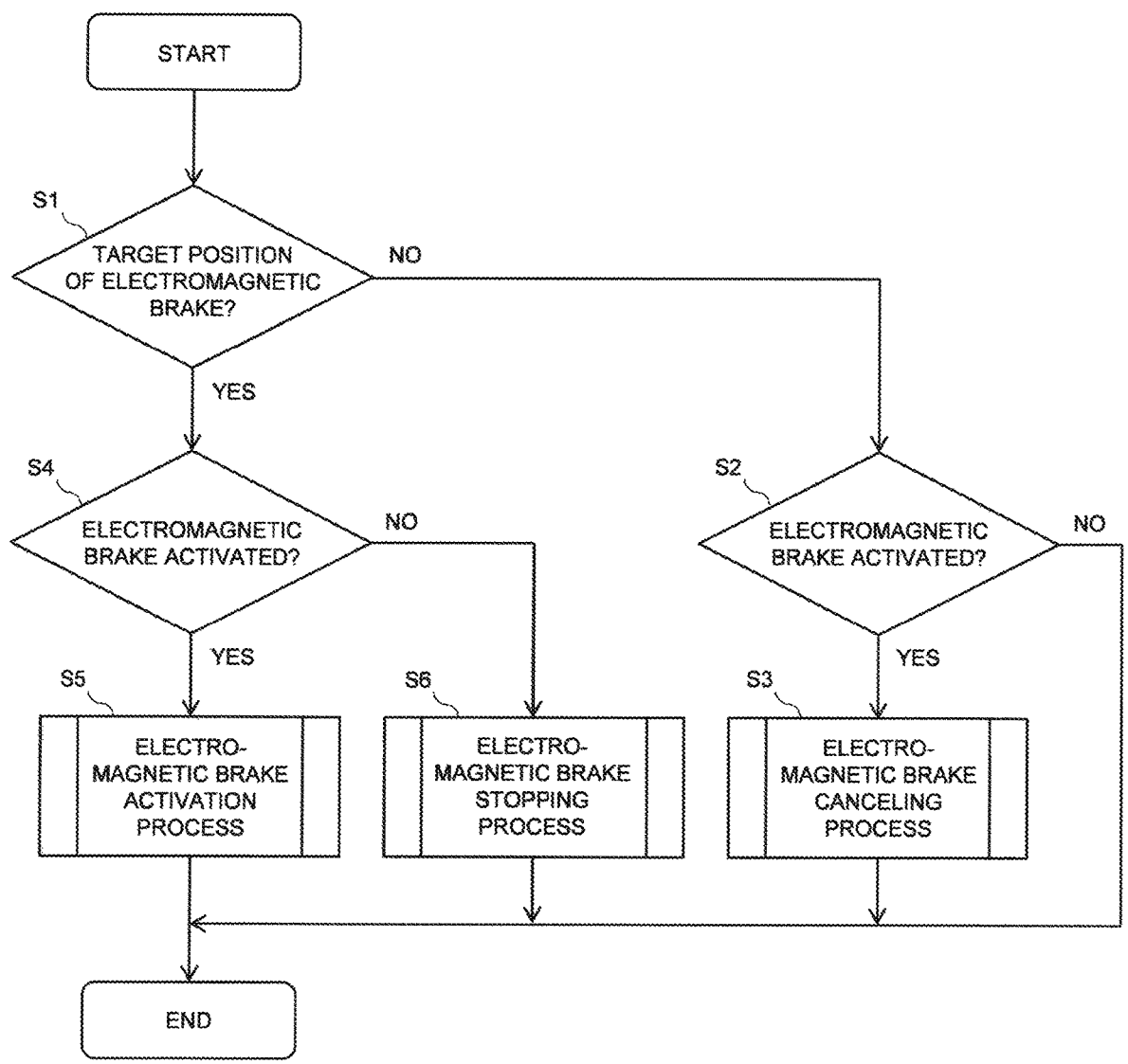
FIG. 9 is a flowchart illustrating an example of an operation method of the input device illustrated in FIG. 1.

Initially, controller 90 determines whether or not a range set by knob 20 is a target position of electromagnetic brake 60 as illustrated in FIG. 9 (step S1). More specifically, controller 90 determines whether or not a rotation angle (current position in the circumferential direction) of knob 20 detected by detector 70 is a target position (predetermined target angle) of electromagnetic brake 60. The target position of electromagnetic brake 60 is determined beforehand based on traveling conditions of the vehicle, a range arrangement, and the like.

For example, when the vehicle travels forward in a state set to N range, rotation of knob 20 is allowed in the direction of switching from N range to D range. However, rotation of knob 20 is prohibited in the direction of switching from N range to R range. During forward traveling in this state, the target position of electromagnetic brake 60 is set to N range. When the rotation angle of knob 20 is a predetermined target angle corresponding to N range, it is determined that the range set by knob 20 is the target position of electromagnetic brake 60. On the other hand, when the rotation angle of knob 20 is not the predetermined target angle corresponding to N range, it is determined that the range set by knob 20 is not the target position of electromagnetic brake 60. In the foregoing situation, the rotation direction of knob 20 for switching from N range to R range is a regulation direction, while the rotation direction of knob 20 for switching from N range to D range is not the regulation direction.

When ranges are arranged around knob 20 as illustrated in FIG. 7, clockwise rotation of knob 20 from P range located at an anticlockwise end of the arrangement is allowed, but anticlockwise rotation of knob 20 from P range is prohibited. Similarly, anticlockwise rotation of knob 20 from S range located at a clockwise end of the arrangement is allowed, but clockwise rotation of knob 20 from S range is prohibited. Accordingly, the ranges located at the ends of the arrangement are specified as target positions of electromagnetic brake 60. When the rotation angle of knob 20 is the predetermined target angle corresponding to either P range or S range, the range set by knob 20 is determined as the target position of electromagnetic brake 60. On the other hand, when the rotation angle of knob 20 is not the predetermined target angle corresponding to either P range or S range, the range set by knob 20 is determined as not the target position of electromagnetic brake 60. In this case, an end stop is set in the rotation prohibited direction (regulation direction) of knob 20 for each of P range and S range.

When determining in step S1 that the range is not the target position of electromagnetic brake 60 (NO), controller 90 further determines whether or not electromagnetic brake 60 is activated (step S2). When determining that electromagnetic brake 60 is not activated (step S2: NO), controller 90 ends the process. When determining that electromagnetic brake 60 is activated (step S2: YES), controller 90 executes an electromagnetic brake canceling process (step S3). This canceling process stops energization of electromagnetic brake 60, for example. Electromagnetic brake 60 is therefore not activated when the set range does not require activation of electromagnetic brake 60. Accordingly, current consumed by electromagnet 63 of electromagnetic brake 60 and a temperature rise of the coil of electromagnet 63 are reduced.

When determining in step S1 that the range is the target position of electromagnetic brake 60 (step S1: YES), controller 90 further determines whether or not electromagnetic brake 60 is activated (step S4). When electromagnetic brake 60 is activated (step S4: YES), controller 90 executes an electromagnetic brake activation process (step S5). When electromagnetic brake 60 is not activated (step S4: NO), controller 90 executes an electromagnetic brake activation process (step S6).

Figure 10:
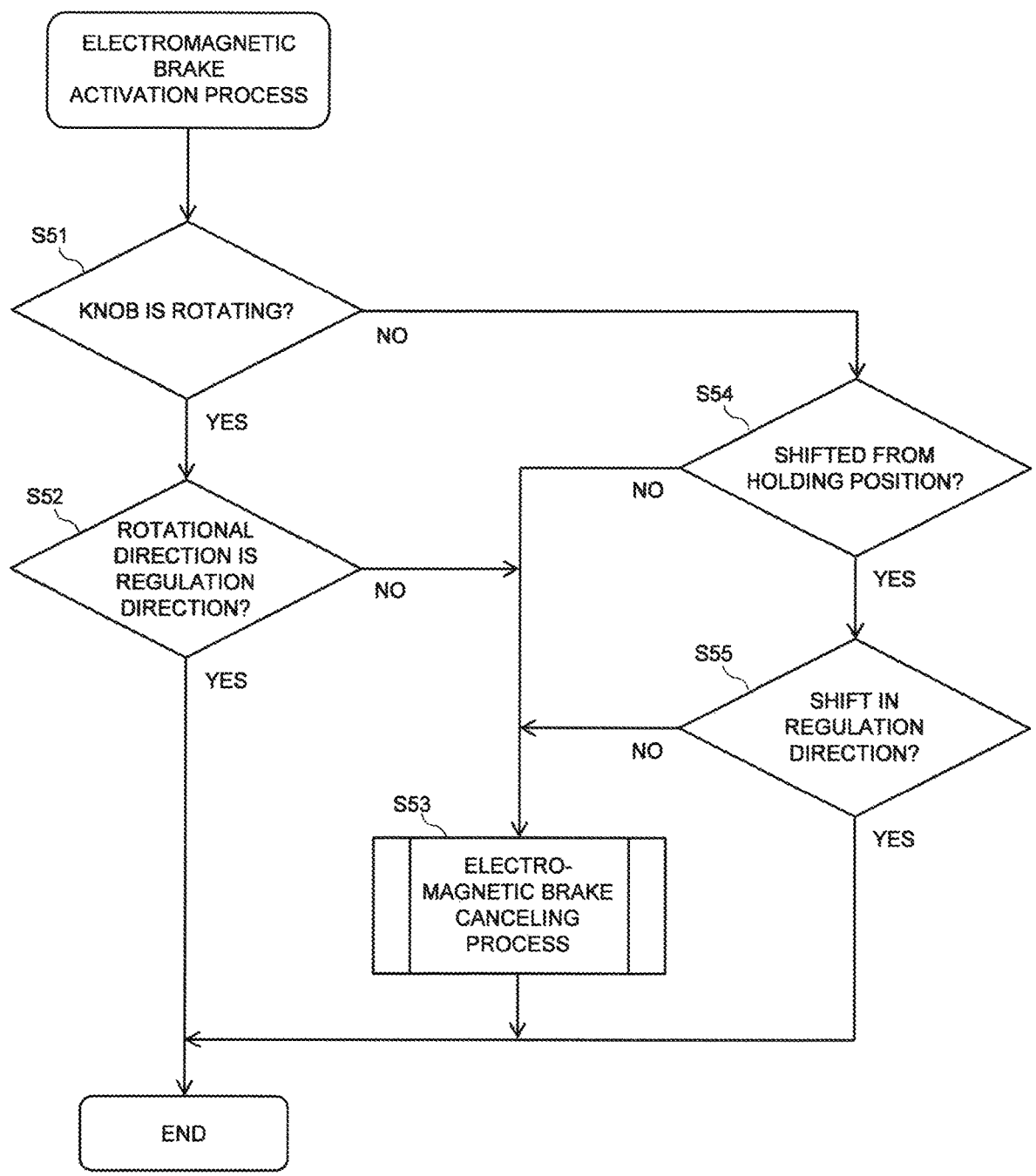
FIG. 10 is a flowchart illustrating an example of an electromagnetic brake operating process illustrated in FIG. 9.

In the electromagnetic brake activation process in step S5 illustrated in FIG. 9, controller 90 determines whether or not knob 20 is rotating as illustrated in FIG. 10 (step S51). During activation of electromagnetic brake 60 in this process, armature 61 is fixed by electromagnet 63 of electromagnetic brake 60. However, elastic member 50 provided between armature 61 and connection member 40 is deformable and allows slight rotation of shaft member 30 and knob 20 connected to connection member 40. Controller 90 therefore determines whether or not there is a difference between at least two rotation angles detected at least at different times based on detection results (rotation angles of knob 20) obtained by detector 70. When a difference is recognized between these rotation angles, controller 90 determines that knob 20 is rotating (step S51: YES).

Subsequently, controller 90 obtains the rotation direction of knob 20 based on increase or decrease of the rotation angle of knob 20, and determines whether or not the obtained rotation direction is the regulation direction (step S52). For example, when knob 20 in P range for which anticlockwise end stop has been set is rotated anticlockwise, the rotation angle of knob 20 decreases. In this case, controller 90 determines that the rotation direction is the regulation direction (step S52: YES), and ends the process. Activation of electromagnetic brake 60 is therefore continued, and electromagnetic brake 60 regulates rotation in the regulation direction other than rotation due to deformation of elastic member 50. Accordingly, the operator feels as if a wall (end stop) for preventing rotation is present in the regulation direction.

On the other hand, when knob 20 in P range is rotated clockwise, for example, the rotation angle of knob 20 increases. In this case, controller 90 determines that the rotation direction is not the regulation direction (step S52: NO), and executes the electromagnetic brake canceling process (step S53). Activation of electromagnetic brake 60 is therefore stopped, and rotation of knob 20 is allowed. As a result, rotation of knob 20 due to deformation of elastic member 50 is followed by rotation of knob 20 due to the activation stop of electromagnetic brake 60. The operator feels these rotations as a series of movements. Accordingly, even if the operator rapidly operates knob 20 in the opposite direction immediately after rotation in the regulation direction, the operator can rotate knob 20 without operational discomfort.

When determining that there is no difference between rotation angles of knob 20 detected by detector 70 at least at two different times, controller 90 determines that knob 20 is not rotating in step S51 (S51: NO).

Subsequently, controller 90 determines whether or not knob 20 has shifted from the holding position (step S54). When the operator does not operate knob 20, for example, no force is applied to knob 20 in the rotation direction. Accordingly, knob 20 is located at the holding position. In addition, as illustrated in FIG. 5, due to restoring force of elastic member 50, each projection 31 of shaft member 30 connected to knob 20 is located at the intermediate position corresponding to the center angle of third groove 64 of armature 61 of electromagnetic brake 60 in the circumferential direction. Controller 90 therefore compares a predetermined holding position (angle) stored in storage unit 92 beforehand with the rotation angle of shaft member 30 detected by detector 70.

As a result of this comparison, when the rotation angle of shaft member 30 coincides with the holding position, controller 90 determines that knob 20 has not been shifted from the holding position (step S54: NO), and executes the electromagnetic brake canceling process (step S53). Activation of electromagnetic brake 60 is therefore stopped, and rotation of knob 20 is allowed. While the operator is not rotating knob 20 as in this situation, rotation regulation for knob 20 by electromagnetic brake 60 is not required. Activation of electromagnetic brake 60 is therefore stopped. Accordingly, current consumption by electromagnet 63 of electromagnetic brake 60 and a temperature rise of the coil of electromagnet 63 are reduced.

On the other hand, for example, even if electromagnetic brake 60 is activated, when force in the rotational direction is applied to knob 20 held by the operator, knob 20 is allowed to slightly shift in the rotational direction by deformation of elastic member 50. Accordingly, controller 90 determines that knob 20 has shifted from the holding position when the rotation angle of shaft member 30 does not coincide with the holding position (step S54: YES).

Subsequently, controller 90 determines whether or not the shift direction is the regulation direction based on a comparison result between the rotation angle of shaft member 30 and the angle of the holding position (step S55). When the shift direction is the regulation direction (step S55: YES), controller 90 ends the process. In this case, electromagnetic brake 60 is continuously activated, and rotation in the regulation direction other than rotation due to deformation of elastic member 50 is regulated by electromagnetic brake 60. Accordingly, when a shift of knob 20 in the regulation direction is detected, electromagnetic brake 60 is continuously activated since there is a high possibility that knob 20 is rotated in the regulation direction, and a clearance between projections 31 and the edges of third grooves 64 in the regulation direction (rotation range of knob 20) is narrow. In this manner, rotation of knob 20 is reliably prevented without a reaction delay even if knob 20 rapidly rotates in the regulation direction.

On the other hand, when the shift direction is not the regulation direction (step S55: NO), controller 90 executes the electromagnetic brake canceling process (step S53). Activation of electromagnetic brake 60 is therefore stopped, and rotation of knob 20 is allowed. When knob 20 held by the operator is shifted in the direction opposite to the regulation direction, there is a low possibility that knob 20 is rotated in the regulation direction. Accordingly, electromagnetic brake 60 is not activated, and current consumption by electromagnet 63 of electromagnetic brake 60 and a temperature rise of the coil are reduced. In addition, when knob 20 is shifted in the direction opposite to the regulation direction, clearances between projections 31 and third grooves 64 increase. Accordingly, even if knob 20 is rapidly rotated in the regulation direction, this rotation of knob 20 is prevented by activation of electromagnetic brake 60 based on a determination concerning the rotation of knob 20 made during a period until projections 31 arrive at the edges of third grooves 64 in the regulation direction.

Figure 11:
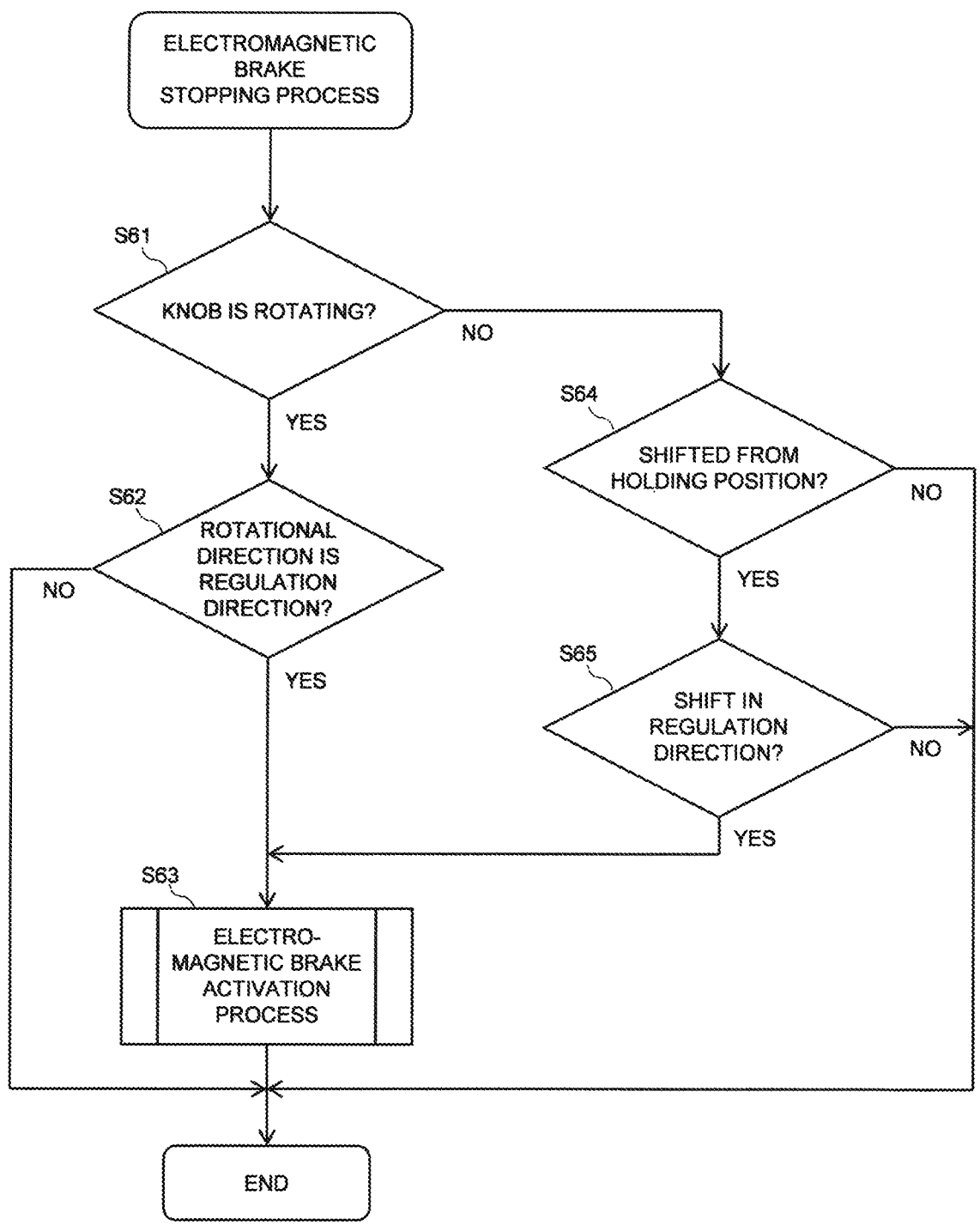
FIG. 11 is a flowchart illustrating an example of an electromagnetic brake stopping process illustrated in FIG. 9.

In the electromagnetic brake stopping process in step S6 in FIG. 9, controller 90 determines whether or not knob 20 is rotating as illustrated in FIG. 11 (step S61). While electromagnetic brake 60 is stopped, rotation of armature 61 of electromagnetic brake 60 is not prevented. Accordingly, knob 20 connected to armature 61 is rotatable. Even if armature 61 is not rotating, knob 20 is allowed to rotate due to deformation of elastic member 50 provided between armature 61 and knob 20.

Accordingly, when determining that knob 20 is rotating based on the rotation angle of knob 20 detected by detector 70 (step S61: YES), controller 90 further determines whether or not the rotation direction of knob 20 corresponding to increase or decrease in the rotation angle of knob 20 is the regulation direction (step S62). When the rotation direction is not the regulation direction (step S62: NO), the process ends. Electromagnetic brake 60 is therefore continuously stopped to continuously allow rotation of knob 20.

On the other hand, when the rotation direction is the regulation direction (step S62: YES), controller 90 executes an electromagnetic brake activation process (step S63). This activation process energizes electromagnetic brake 60 to prevent rotation of knob 20. In this case, rotation in the regulation direction other than rotation due to deformation of elastic member 50 is regulated by electromagnetic brake 60, and the operator feels as if a wall for preventing rotation is present in the regulation direction.

When determining in step S61 that the knob 20 is not rotating (step S61: NO), controller 90 further determines whether or not knob 20 has shifted from the holding position (step S64). For example, when knob 20 is not operated by the operator, shaft member 30 is located at the holding position. In this case, controller 90 determines that knob 20 has not been shifted from the holding position (step S64: NO), and ends the process. In this manner, activation of electromagnetic brake 60 is stopped when rotation regulation of knob 20 by electromagnetic brake 60 is not required. Accordingly, current consumption by electromagnet 63 of electromagnetic brake 60 and a temperature rise of the coil are reduced.

For example, even if knob 20 is not rotating, the position of shaft member 30 is displaced from the holding position by force in the rotation direction applied from the operator to knob 20 held by the operator. In this case, controller 90 determines that knob 20 has been shifted from the holding position (step S64: YES).

Controller 90 subsequently determines whether or not the shift direction is the regulation direction based on a comparison result between the rotation angle of shaft member 30 and the angle of the holding position (step S65). When the shift direction is the regulation direction (step S65: YES), controller 90 executes the electromagnetic brake activation process (step S63). This activation process prevents rotation of knob 20. As described above, even if knob 20 is not rotating, electromagnetic brake 60 is continuously activated when knob 20 shifts and stops in the regulation direction in consideration of a high possibility that knob 20 rotates in the regulation direction, and a narrow rotation range of knob 20 due to deformation of elastic member 50. In this manner, rotation of knob 20 is reliably prevented without a reaction delay even if knob 20 rapidly rotates in the regulation direction.

On the other hand, when the shift direction is not the regulation direction (step S65: NO), controller 90 ends the process. Electromagnetic brake 60 is therefore continuously stopped to continuously allow rotation of knob 20.

According to input device 10 configured as above, when knob 20 is not rotating, controller 90 determines whether to regulate rotation of knob 20 based on the rotation angle of knob 20 which shifts from the holding position in the circumferential direction around the rotation axis of knob 20 due to deformation of elastic member 50.

For example, when knob 20 is stopped at the holding position, or when knob 20 shifts in the direction opposite to the regulation direction of rotation of knob 20 from the holding position and stops at the shifted position, there is no possibility or low possibility that knob 20 is rotated in the regulation direction. In this case, electromagnetic brake 60 is stopped, so that power consumption by electromagnetic brake 60 and a temperature rise of the coil are reduced.

On the other hand, for example, when knob 20 shifts in the regulation direction of rotation of knob 20 from the holding position and stops at the shifted position, there is a high possibility that knob 20 is rotated in the regulation direction. In addition, the rotation range of knob 20 due to deformation of elastic member 50 is narrow. In this case, electromagnetic brake 60 is activated beforehand to prevent a delay of reaction to the rotation of knob 20, and allow the operator to operate without operational discomfort.

During rotation of knob 20, controller 90 determines whether to regulate rotation of knob 20 based on the rotation direction of knob 20 corresponding to the rotation angle of knob 20. For example, the operator may accidentally rotate knob 20 in the regulation direction on the end stop side, and then rotate knob 20 in the direction opposite to the regulation direction immediately after regulation of the rotation. Even in a case of rapid operation as in this situation, whether to regulate rotation of knob 20 is determined during rotation of knob 20 due to deformation of elastic member 50. Regulation of rotation in both the directions is therefore avoidable. In this case, the operator feels as if there is a wall for regulating rotation in one direction and allowing rotation in the other direction. Accordingly, the operator can operate input device 10 without operational discomfort.

Controller 90 does not activate electromagnetic brake 60 when the rotation angle of knob 20 is not a predetermined target angle. When knob 20 is rotated to a position other than the target position (predetermined target angle) of electromagnetic brake 60 such as a range for which an end stop has been set, for example, electromagnetic brake 60 is not required to be activated. Accordingly, electromagnetic brake 60 is stopped, so that power consumption by electromagnetic brake 60 and a temperature rise of the coil are reduced.

Other Exemplary Embodiments

According to the exemplary embodiment described herein, elastic member 50 is provided between connection member 40 and armature 61 of electromagnetic brake 60. However, elastic member 50 may be disposed at other positions as long as elastic member 50 is interposed between knob 20 and electromagnetic brake 60. For example, shaft member 30 may be divided in the rotation axis direction of shaft member 30 to provide elastic member 50 between divisions of shaft member 30 thus produced.

According to the exemplary embodiment described herein, when the range is not the target position of electromagnetic brake 60 (step S1: NO), controller 90 determines whether or not electromagnetic brake 60 is activated (step S2). When electromagnetic brake 60 is activated (step S2: YES), controller 90 executes the electromagnetic brake canceling process (step S3). However, the processing in steps S2 and S3 may be omitted in consideration that electromagnetic brake 60 generally stops when the range is not the target position of electromagnetic brake 60.

Any of the exemplary embodiments described herein may be combined as long as no incompatibility is produced between one another. Many improvements or different exemplary embodiments of the present disclosure may easily occur to those skilled in the art based on the description presented herein. Accordingly, the description herein should be interpreted only as a specific example, and presented only for purposes of teachings for practicing best modes of the present disclosure by those skilled in the art. Substantial modifications of details of at least either the structure or the function of the present disclosure may be made without departing from the spirit of the present disclosure.

The input device according to the present disclosure is a useful input device or like devices capable of reducing power consumption, and reducing operational discomfort during rotation of a knob by an operator.

What is claimed is:

1. An input device comprising:
    a knob that is rotatable;
    a moderator that holds the knob at a predetermined holding position when the knob is not operated;
    a detector that detects a rotation angle of the knob in a circumferential direction around a rotation axis of the knob;
    an electromagnetic brake that regulates rotation of the knob;
    an elastic member provided between the knob and the electromagnetic brake, and integrally rotates with the knob, the rotation of the elastic member being regulated by the electromagnetic brake; and
    a controller that controls the electromagnetic brake based on a detection result obtained by the detector,
    wherein the controller is configured not to activate the electromagnetic brake when a current position of the knob in the circumferential direction is not a target position for rotation regulation of the knob, and
    when the current position of the knob in the circumferential direction is in the holding position as the target position for the rotation regulation of the knob, the controller is configured to determine whether to regulate rotation of the knob based on a rotation direction of the knob, or on the rotation angle of the knob that shifts from the holding position of the knob in the circumferential direction due to deformation of the elastic member, and the controller is configured not to activate the electromagnetic brake when the current position of the knob in the circumferential direction is the holding position as the target position for the rotation regulation of the knob and when the knob does not shift from the holding position.

2. The input device according to claim 1, wherein the controller is configured to activate the electromagnetic brake when the current position of the knob in the circumferential direction is the holding position as the target position for the rotation regulation of the knob and when the knob shifts in a direction of the rotation regulation of the knob from the holding position.

3. The input device according to claim 1, wherein the controller is configured not to activate the electromagnetic brake when the current position of the knob in the circumferential direction is the holding position as the target position for the rotation regulation of the knob and when the knob shifts in a direction opposite to a direction of the rotation regulation of the knob from the holding position.

4. The input device according to claim 1,
    when the current position of the knob in the circumferential direction is the holding position as the target position for the rotation regulation of the knob,
    (a) the controller is configured not to activate the electromagnetic brake when the knob does not shift from the holding position,
    (b) the controller is configured to activate the electromagnetic brake when the knob shifts in a direction of the rotation regulation of the knob from the holding position, and
    (c) the controller is configured not to activate the electromagnetic brake when the knob shifts in a direction opposite to the direction of the rotation regulation of the knob from the holding position.

* * * * *